United States Patent
Sugihara et al.

(10) Patent No.: US 6,893,749 B2
(45) Date of Patent: May 17, 2005

(54) SIC-FORMED MATERIAL

(75) Inventors: Takaomi Sugihara, Chigasaki (JP);
Kenichi Kanai, Gotemba (JP);
Tomonori Tahara, Gotemba (JP);
Akihiro Kuroyanagi, Chigasaki (JP)

(73) Assignee: Tokai Carbon Company, Ltd., Tokyo (JP)

( * ) Notice: Subject to any disclaimer, the term of this patent is extended or adjusted under 35 U.S.C. 154(b) by 706 days.

(21) Appl. No.: 09/842,519

(22) Filed: Apr. 25, 2001

(65) Prior Publication Data

US 2002/0037801 A1 Mar. 28, 2002

(30) Foreign Application Priority Data

Aug. 2, 2000 (JP) .................................... 2000-233828

(51) Int. Cl.[7] .............................................. B32B 19/00
(52) U.S. Cl. ................................. 428/698; 427/249.15
(58) Field of Search ...................... 428/698; 427/249.15

(56) References Cited

U.S. PATENT DOCUMENTS

| | | | | |
|---|---|---|---|---|
| 3,859,399 A | * | 1/1975 | Bailey et al. ............... | 264/29.1 |
| 4,701,427 A | * | 10/1987 | Boecker et al. ............. | 501/92 |
| 5,313,078 A | * | 5/1994 | Fujii et al. .................. | 257/77 |
| 5,656,098 A | * | 8/1997 | Ishikawa et al. ............ | 136/256 |
| 5,801,073 A | * | 9/1998 | Robbins et al. ............. | 438/125 |
| 6,254,964 B1 | * | 7/2001 | Saito et al. ................. | 428/141 |
| 6,695,984 B1 | * | 2/2004 | Odaka et al. ............... | 252/504 |
| 6,746,776 B1 | * | 6/2004 | Kumagai et al. ........... | 428/450 |

* cited by examiner

Primary Examiner—Bret Chen
(74) Attorney, Agent, or Firm—Flynn, Thiel, Boutell & Tanis, P.C.

(57) ABSTRACT

A nitrogen-doped n-type SiC-formed material consisting of high purity β-type crystals, which exhibits low resistivity and low light transmittance and is suitably used as a substrate for semiconductor fabricating devices, and a method of manufacturing the SiC-formed material by which the SiC-formed material is obtained at high productivity and improved deposition rate. The SiC-formed material is produced by the CVD method introducing nitrogen gas together with raw material gases and a carrier gas to form a SiC film on a substrate, and removing the substrate. The material has a specific gravity of 3.15 or more, light transmittance of 1.1 to 0.05%, and resistivity of $3 \times 10^{-3}$ to $10^{-5}$ Ωm. The SiC-formed material is manufactured under conditions of the raw material gas concentration, in terms of the ratio of the raw material flow rate (l/min) to the carrier gas flow rate (l/min), introduced into the CVD reaction chamber, of 5–15 vol %, the nitrogen gas concentration, in terms of the ratio of the nitrogen gas flow rate (l/min) to the raw material gas flow rate (l/min), of 10–120 vol %, and the raw material gas retardation time of 7–110 seconds, wherein, the raw material gas retardation time (sec)={(Effective reaction volume in the reaction chamber (l))/(raw material gas flow rate (l/min))}×{(273+20)/(273+Reaction temperature (° C.))}×60.

8 Claims, 2 Drawing Sheets

SIC-FORMED MATERIAL

BACKGROUND OF THE INVENTION

1. Field of the Invention

The present invention relates to a material formed from SiC (SiC-formed material), and more particularly to a nitrogen-doped n-type CVD-SiC-formed material of high purity β-type crystals, useful as a material for heaters and dummy wafers for semiconductor devices, as well as other applications such as sceptors, core tubes, and the like.

2. Description of Background Art

The SiC-formed materials, which are obtained by depositing SiC on the surface of a substrate by the CVD (chemical vapor deposition) method, forming a film from the deposited material (filming), and removing the substrate, have denser (poreless) properties, have a higher purity, and exhibit more excellent corrosion resistance and heat resistance than SiC-formed materials produced by a sintering process. Therefore, some former type SiC-formed materials are used as a material for heaters and dummy wafers for the manufacture of semiconductor devices, and other applications such as sceptors, core tubes, and the like. However, when this type of SiC-formed materials are used as heaters for the manufacture of semiconductor devices, for example, resistivity as low as that possessed by SiC produced by the sintering process is required in addition to the above excellent characteristics. When used as a material for dummy wafers, lower light transmittance is required. Thus, SiC-formed materials having satisfactory characteristics commonly usable as a substrate for semiconductor manufacturing cannot be obtained by the conventional SiC filming method using the CVD technique.

A method of applying the CVD-SiC-formed materials to heaters by decreasing the resistivity has been known in the art. International Conference Chemical Vapor Deposition, The Electro Chemical Society, 1975, P749–757 (CVD SiC HEATING ELEMENTS: ALTERATION OF ELECTRICAL RESISTANCE BY DOPING by H. Beutler, S. Oesterle and K. K. Yee) discloses a heater produced by forming a layer of SiC(N) with an SiC(N)/TiN/SiC structure formed to a thickness of 0.44 μm by introducing nitrogen gas at a flow rate of 0.4 l/minute at a temperature of 40° C. into the raw material methyl trichlorosilane (MTS) under conditions of a hydrogen stream of 2.0 l/minute, a vapor deposition temperature of 1400° C. and one atmosphere. However, because it is difficult to arbitrarily control the ratio of the raw material MTS concentration and the nitrogen gas concentration, pores are readily produced inside the film. It is thus difficult to obtain CVD-SiC of dense (or close) properties, exhibiting high gas impermeability.

The following method has been proposed as a method of producing nitrogen-doped CVD-SiC-formed materials by controlling the amount of nitrogen gas to be introduced together with raw material gases. Specifically, the method comprises forming a very thin SiC film on a silicon single crystal substrate by introducing monosilane ($SiH_4$) gas and propane gas as raw material gases, and hydrogen gas as a carrier gas, onto the substrate heated to 900 to 1,200° C., then introducing nitrogen gas as a dopant at a flow rate of $1 \times 10^{-2}$ to 1 cc/minute together with the raw material gases at a flow rate of 0.05–0.3 cc/minute (the ratio of the nitrogen gas to the raw material gases is, ($1 \times 10^{-2}$ to 1 cc/minute)/(0.05–0.3 cc/minute)=0.01/0.1–1/0.6=10 to 167 vol %), to grow an n-type 3C type SiC single crystal film on the substrate. A thin film with a thickness of 0.5–3 μm is grown in one hour (Japanese Patent Publication 43240/1991). The growth rate of the film thickness in this method is very slow (0.5–3 μm/hour). The shortest time for obtaining a film with a thickness of 3 mm, which is a practically required thickness for a heater in a heating apparatus, is 1000 hours (3 mm/3 μm/hour). This poses a problem in terms of productivity.

Polycrystal CVD-SiC containing a Group III element and polycrystal CVD-SiC containing a Group V element have been proposed (Japanese Patent Application Laid-open No. 252307/1991) in an attempt to provide the CVD-SiC with characteristics such as a coefficient of thermal expansion, specific resistance, thermal conductivity, etc. which are special, according to applications. Change in the specific resistance when a Group V element (N) is added was shown, but the results are not necessarily satisfactory when the product is used as a raw material for heaters for semiconductor fabrication devices.

To overcome the above problems in SiC-formed materials which are used particularly as a substrate for semiconductor fabrication devices, the present invention has been achieved by carrying out diversified experiments and investigations on the relationship among the reaction conditions, such as the ratio of concentration of gases introduced into the reactor and the residence time of the gases, various characteristics of SiC-formed materials (films) produced, and the deposition rate.

An object of the present invention is to provide an n-type SiC-formed material exhibiting low resistivity and light go transmittance, in addition to other superior characteristics inherently possessed by CVD-SIC, such as high density (poreless), high purity, etc., and suitably used as a substrate for semiconductor fabricating devices, and a method of manufacturing the SiC-formed material by which the SiC-formed materials are obtained at a high productivity and improved deposition rate.

SUMMARY OF THE INVENTION

To achieve the above object, the SiC-formed material of the present invention is an SiC-formed material produced by the CVD method using nitrogen gas together with raw material gases, characterized by possessing a specific gravity of 3.15 or more, light transmittance of 1.1 to 0.05%, and resistivity of $3 \times 10^{-3}$ to $10^{-5}$ Ωm.

The method for manufacturing the SiC-formed material of the present invention comprises producing an SiC film on the surface of a substrate by the CVD method using nitrogen gas together with raw material gases, and removing the substrate to obtain the SiC-formed material, wherein the raw material gas concentration, in terms of the ratio of the raw material flow rate (l/min) to the carrier gas flow rate (l/min) introduced into the CVD reaction chamber in which the substrate is located, is 5–15 vol %, the nitrogen gas concentration, in terms of the ratio of the nitrogen gas flow rate (l/min) to the raw material gas flow rate (l/min), is 10–120 vol %, the raw material gas resident time defined by the following formula is controlled to 7–110 seconds, and the deposition rate is controlled to 20–400 μm/hour.

Raw material gas retardation time (sec)={(Effective reaction volume in the reaction chamber (l))/(raw material gas flow rate (l/min))}×{(273+20)/(273+Reaction temperature (° C.))}×60

Other objects, features and advantages of the invention will hereinafter become more readily apparent from the following description.

DETAILED DESCRIPTION OF THE INVENTION AND PREFERRED EMBODIMENT

The method for manufacturing the SiC-formed material of the present invention is based on the process of producing an SiC film on the surface of a substrate by the CVD method using nitrogen gas together with raw material gases, and removing the substrate to obtain the SiC-formed material.

Figure 1:
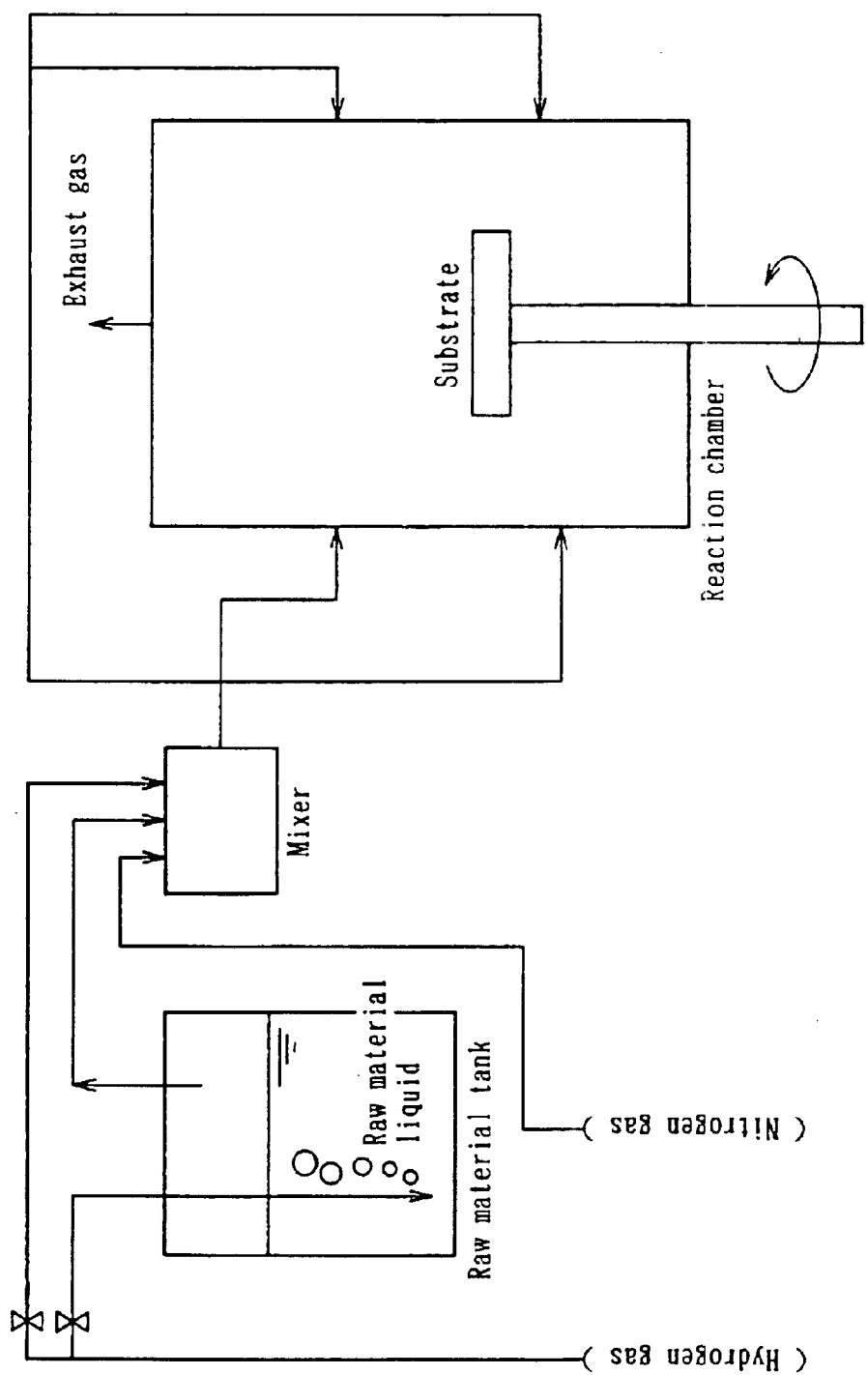
FIG. 1 is a schematic diagram showing one embodiment of the CVD reactor for carrying out the present invention.

The apparatus for carrying out this method comprises, as shown in FIG. 1, a reaction chamber (reaction vessel), a heating device (not shown) consisting of high frequency coils and the like for heating the reaction chamber provided inside or outside thereof, a gas-introducing pipe to introduce the raw material gas and nitrogen gas for doping into the reaction chamber, and an exhaust port for discharging gases in the reaction chamber.

A carrier gas (hydrogen) is bubbled through the raw material liquid in the raw material tank to produce a mixed gas of raw material gas and carrier gas, which is introduced into a mixer together with nitrogen gas for doping. The mixture of raw material gas, carrier gas, and nitrogen gas is introduced into the reaction chamber via the gas-introducing pipe, and used for formation of SiC film on a substrate located in the reaction chamber and heated to a prescribed temperature by the CVD method.

Silane gases such as methyl trichlorosilane (MTS) ($SiCH_3Cl_3$), or $SiHCl_3$, $SiH_4$ and hydrocarbon gas can be used as raw material gases. As the carrier gas, hydrogen gas or argon gas is used. The hydrogen gas or argon gas may be used in combination. As the nitrogen gas for doping, nitrogen gas with a purity of at least 99.99% or more and an oxygen content of less than 5 ppm can be used. A graphite material is suitably used as the substrate.

In the present invention, the raw material gas concentration, in terms of the ratio of the raw material flow rate (l/min) to the carrier gas flow rate (l/min), introduced into the reaction chamber is 5–15 vol %, the nitrogen gas concentration, in terms of the ratio of the nitrogen gas flow rate (l/min) to the raw material gas flow rate (l/min), is 10–120 vol %, and the raw material gas retardation time is controlled to 7–110 seconds, wherein, the raw material gas retardation time (sec)={(Effective reaction volume in the reaction chamber (l))/(raw material gas flow rate (l/min))}× {(273+20)/(273+Reaction temperature (° C.))}×60.

As the substrate, a graphite material having an impurity content of 20 ppm or less, a coefficient of thermal expansion of $3.0–4.5×10^{-6}$/degree(° C.), and a bulk specific gravity of 1.75–1.85 is preferably used. The substrate temperature is controlled to 1100–1500° C.

The deposition rate is controlled to 20–400 μm/hour by the above reaction conditions, thereby producing a dense, high purity (with an impurity content other than N, C, and Si of 150 ppb or less), nitrogen-doped CDV-SiC film having n-type semiconductor characteristics and other characteristics defined in claim 1, i.e. a specific gravity of 3.15 or more, light transmittance of 1.1 to 0.05%, and resistivity of $3×10^{-3}$ to $10^{-5}$ Ωm.

No SiC film meeting the various characteristics of the present invention can be obtained if the above reaction conditions are not satisfied. In particular, when the retardation time of the raw material gases is less than 7 seconds, the specific gravity of SiC is decreased, which gives rise to lower closeness. Such an SiC product easily absorbs impurity gases to cause oxidation resistance and corrosion resistance to deteriorate. If the retardation time exceeds 110 seconds, the deposition rate is retarded.

If the nitrogen gas concentration is less than 10 vol %, the product has both a high resistivity and high light transmittance. The resulting film is thus light permeable. If more than 120 vol %, on the other hand, pores are easy to form in SiC and the surface of the resulting SiC film tends to be uneven.

After film-forming, the SiC film produced outside the circumference of the substrate graphite is removed by grinding, and then the substrate graphite is removed by a method such as air oxidation, mechanical processing, or grinding, thereby obtaining an SiC-formed material. The SiC-formed material thus obtained is worked into various forms or surface-treated to make products suitable for the intended application.

EXAMPLES

The present invention will be described in more detail by examples and comparative examples. These examples illustrate embodiments of the present invention and should not be construed as limiting the present invention.

Example 1

A CVD-SiC-formed material was manufactured using a CVD reactor shown in FIG. 1. The reactor (reaction chamber) was provided with nozzles for introducing gases and six graphite disks with a diameter of 8 inches and a thickness of 6 mm. The nozzles were located so that the raw material gases would not be injected directly onto the substrate. Namely, the side and upper surface of the reactor were directly exposed to the raw material gases injected from the nozzles, but the substrate was exposed to such gases only indirectly.

Methyl trichlorosilane (MTS) was used as the raw material gas and hydrogen gas was used as the carrier gas. The feed rate of the raw material gas was 200 l/min and the MTS concentration was 7.5 vol %. The film was formed for 75 hours under conditions of a raw material gas flow rate of 140 l/minute (raw material gas concentration: 70 vol %), raw material gas retardation time of 36.8 seconds, and reaction temperature of 1,400° C. The deposition rate was 47 μm/hour.

After the reaction, the graphite substrate was removed to obtain a CVD-SiC film (test material) with a thickness of 3.5 mm. Film uniformity was evaluated by observation of external appearance of the resulting SiC-formed material, the total impurity concentration was analyzed by purity analysis, the resistivity and light transmittance were measured, the heat shock resistance test, corrosion resistance test, nitrogen separation examination, and 1000° C. heat test examination were carried out using the resulting SiC-formed material according to the following methods.

Measurement of Resistivity:

The SiC-formed material was subjected to surface processing (removing) to obtain a sheet with a thickness of 3 mm. The sheet was cut into a size of 4 mm×40 mm, which were used for the measurement of resistivity.

Measurement of Light Transmittance:

The SiC-formed material was subjected to surface processing (removing) to obtain a sheet with a thickness of 0.5 mm. Light transmittance in the near infrared region of 500–3000 nm was measured using self-recording spectrophotometer (UV-3100 PC) manufactured by Shimazu Corp.

Heat Shock Resistance Test:

The SiC-formed material is subjected to surface processing (removing) to obtain a sheet with a thickness of 3 mm.

A disk with a diameter of 250 mm is prepared from the film and subjected to a 500° C.←→1200° C. cycle test, one cycle consisting of maintaining the sample at 1200° C. for 10 minutes in a heater, removing the sample from the heater and quenching it to 500° C., and again placing it in the heater at 1200° C. After 20 cycles of this test, formation of cracks is examined.

Corrosion Resistance Test:

The SiC-formed material was subjected to surface processing (removing) to obtain a sheet with a thickness of 3 mm. The sheet was cut into a size of 4 mm×40 mm, immersed in a stream of 100% hydrogen chloride (flow rate: 5 l/min) at 1200° C. for 15 hours to determine the weight change.

Test for Thermal Stability of Resistance (R-T Cycle Test):

The SiC-formed material was subjected to surface processing (removing) to obtain a sheet with a thickness of 3 mm. The sheet was cut into a size of 4 mm×40 mm and placed in a heater under inert gas atmosphere. A resistivity-heating temperature (R-T) characteristic evaluation was repeated 100 times to evaluate the change of the R-T curve. When nitrogen separates from the formed material, the R-T curve changes every cycle.

1000° C. Heat Test:

The SiC-formed material was subjected to surface processing to obtain a film with a thickness of 3 mm. A disk with a diameter of 250 mm was produced. A plane heater was fabricated from the SiC-formed material and heated to 1000° C. by causing electric current to flow therethrough, to investigate temperature distribution (the temperature difference from 1000° C. at each point) all over the heater.

The results obtained using the test material in Example 1 are shown below.

External Appearance Observation:

The film was uniform with no irregularity on the surface.

Specific Gravity:

The specific gravity was as high as 3.20.

Purity Analysis:

The total impurity concentration was as small as 105 ppb, indicating the material was highly pure.

Measurement of Resistivity:

A low resistivity ($1.4 \times 10^{-4}$ Ωm) was confirmed.

Measurement of Light Transmittance:

A low light transmittance value of 0.17% was confirmed.

Heat Shock Resistance Test:

No cracks were observed, indicating strong heat shock resistance of the test material.

Corrosion Resistance Test:

A small weight decrease of 1.69 wt % was confirmed.

Figure 2:
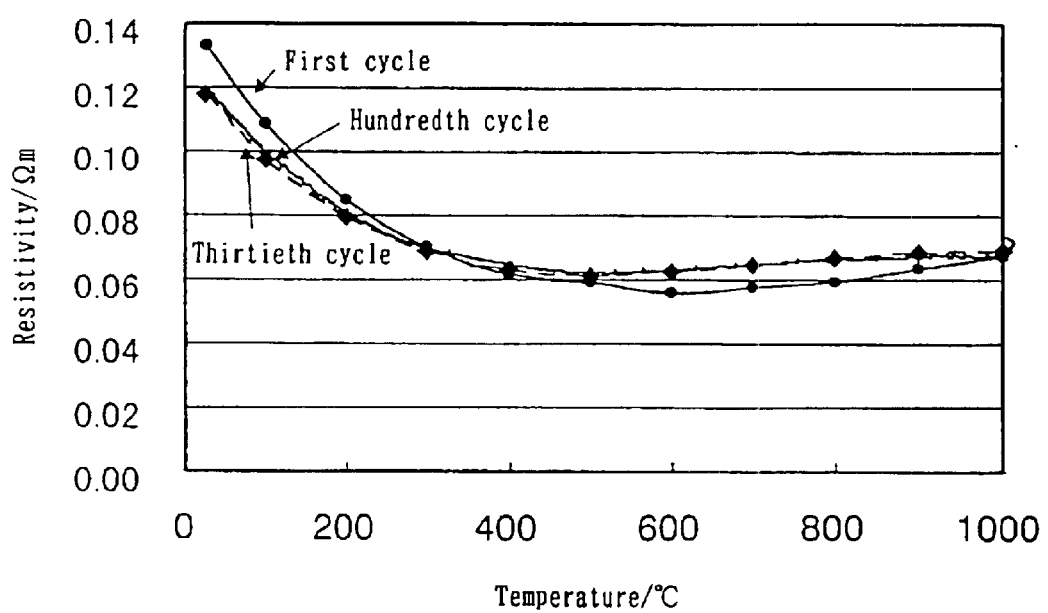
FIG. 2 is a graph showing an example of the R-T curve of the SiC-formed material of the present invention.

Nitrogen Separation Test:

Change of the R-T curve at the first, thirtieth, and hundredth evaluation of the resistivty-heating temperature (R-T) characteristic is shown in FIG. 2. As shown in FIG. 2, almost no change was seen in the R-T curve, indicating that there was no nitrogen separation from the SiC-formed material. The R-T curve of the degree shown in FIG. 2 indicates that there was no change.

1000° C. Heat Test:

The temperature distribution change at each point was ±0.1%. Therefore, there was almost no change.

Examples 2–11

CVD-SiC-formed materials were prepared using the same CVD reactor as in Example 1 under the conditions shown in Table 1. The deposition rate and the thickness of the resulting SiC films are shown in Table 1. The same measurement and test as in Example 1 were carried out using the resulting formed materials. The results are shown in Tables 2–3. As shown in Tables 2–3, the tested materials in Examples 2–9 exhibited the same high purity and excellent characteristics as the test material in Example 1.

TABLE 1

| Example | Reaction temp. (° C.) | Reaction time (hour) | Raw material gas | | Residence time (sec) | Nitrogen gas | | SiC formed material | |
|---|---|---|---|---|---|---|---|---|---|
| | | | Flow rate (l/min) | Conc. (vol %) | | Flow rate (l/min) | Conc. (vol %) | Thickness (mm) | Deposition rate (μm/h) |
| 2 | 1400 | 75 | 200 | 7.5 | 36.8 | 20 | 10 | 4.2 | 56 |
| 3 | 1400 | 75 | 200 | 7.5 | 36.8 | 60 | 30 | 3.7 | 49 |
| 4 | 1400 | 75 | 200 | 7.5 | 36.8 | 180 | 90 | 3.3 | 44 |
| 5 | 1400 | 75 | 200 | 7.5 | 36.8 | 240 | 120 | 3.0 | 40 |
| 6 | 1400 | 12 | 1000 | 7.5 | 7.4 | 700 | 70 | 4.7 | 392 |
| 7 | 1400 | 75 | 67 | 7.5 | 109.8 | 47 | 70 | 1.6 | 21 |
| 8 | 1400 | 75 | 200 | 5.0 | 36.8 | 140 | 70 | 2.5 | 33 |
| 9 | 1400 | 40 | 200 | 15.0 | 36.8 | 140 | 70 | 3.6 | 90 |
| 10 | 1500 | 75 | 200 | 7.5 | 34.7 | 140 | 70 | 4.8 | 64 |
| 11 | 1150 | 75 | 200 | 7.5 | 43.3 | 140 | 70 | 1.8 | 24 |

TABLE 2

| Example | External appearance | Total impurities (ppb) | Resistivity ($\times 10^{-4}$ Ωm) | Light transmittance (%) | Heat shock resistance | Corrosion resistance (wt loss %) | Specific gravity |
|---|---|---|---|---|---|---|---|
| 2 | Good | 92 | 30 | 1.05 | No cracks | 1.67 | 3.20 |
| 3 | Good | 104 | 10 | 0.40 | No cracks | 1.68 | 3.20 |
| 4 | Good | 98 | 1.1 | 0.15 | No cracks | 1.80 | 3.19 |
| 5 | Good | 100 | 0.8 | 0.13 | No cracks | 1.70 | 3.17 |
| 6 | Good | 138 | 1.1 | 0.05 | No cracks | 2.40 | 3.15 |
| 7 | Good | 96 | 1.7 | 0.21 | No cracks | 1.65 | 3.20 |
| 8 | Good | 99 | 1.5 | 0.24 | No cracks | 1.72 | 3.20 |

TABLE 2-continued

| Example | External appearance | Total impurities (ppb) | Resistivity (×10⁻⁴ Ωm) | Light transmittance (%) | Heat shock resistance | Corrosion resistance (wt loss %) | Specific gravity |
|---|---|---|---|---|---|---|---|
| 9 | Good | 110 | 1.2 | 0.16 | No cracks | 1.83 | 3.18 |
| 10 | Good | 96 | 1.7 | 0.21 | No cracks | 1.65 | 3.17 |
| 11 | Good | 138 | 1.1 | 0.09 | No cracks | 2.40 | 3.19 |

*Heat shock resistance: The thickness of tested materials in Example 6-8 was 1.5 mm

TABLE 3

| Example | Nitrogen separation test (Change in the R-T curve) | 1000° C. Heat test (Temperature distribution at each point: ±%) |
|---|---|---|
| 2 | None | 0.3 |
| 3 | None | 0.2 |
| 4 | None | 0.1 |
| 5 | None | 0.1 |
| 6 | None | 0.1 |
| 7 | None | 0.1 |
| 8 | None | 0.1 |
| 9 | None | 0.2 |
| 10 | None | 0.1 |
| 11 | None | 0.1 |

Comparative Examples 1–8

CVD-SiC-formed materials were prepared using the same CVD reactor as in Example 1 under the conditions shown in Table 4. The deposition rate and the thickness of the resulting SiC films are shown in Table 4. The test material of Comparative Example 7 was prepared by the reaction sintering method (diameter: 8 inches, thickness: 0.5 mm and 3 mm), and the test material of Comparative Example 8 was prepared from the SiC-formed material with a diameter of 8 inches and thickness of 5 mm or 3 mm by producing an SiC film with a thickness of 100 μm by the CVD method at 1400° C. The same measurement and test as in Example 1 were carried out using the resulting formed materials. The results are shown in Tables 5–6.

TABLE 4

| Comp. Example | Reaction temp. (° C.) | Reaction time (hour) | Raw material gas Flow rate (l/min) | Raw material gas Conc. (vol %) | Residence time (sec) | Nitrogen gas Flow rate (l/min) | Nitrogen gas Conc. (vol %) | SIC formed material Thickness (mm) | SIC formed material Deposition rate (μm/h) |
|---|---|---|---|---|---|---|---|---|---|
| 1 | 1400 | 75 | 200 | 7.5 | 36.8 | 10 | 5 | 4.2 | 56 |
| 2 | 1400 | 75 | 200 | 7.5 | 36.8 | 260 | 130 | 2.8 | 37 |
| 3 | 1400 | 10 | 1200 | 7.5 | 6.1 | 840 | 70 | 4.6 | 460 |
| 4 | 1400 | 100 | 60 | 7.5 | 122.6 | 42 | 70 | 1.6 | 16 |
| 5 | 1400 | 75 | 200 | 4.0 | 36.8 | 140 | 70 | 2.2 | 29 |
| 6 | 1400 | 35 | 200 | 17.0 | 36.8 | 140 | 70 | 3.6 | 103 |
| 7 | — | — | — | — | — | — | — | — | — |
| 8 | 1400 | 2.5 | 200 | 7.5 | 36.8 | 0 | — | 0.1 | 40 |

TABLE 5

| Comp. Example | External appearance | Total impurities (ppb) | Resistivity (×10⁻⁴ Ωm) | Light transmittance (%) | Heat shock resistance (Cracks*) | Corrosion resistance (wt loss %) | Specific gravity |
|---|---|---|---|---|---|---|---|
| 1 | Good | 103 | 100 | 2.3 | No cracks | 1.72 | 3.20 |
| 2 | Irregularity | 143 | 0.8 | 0.05 | (3) | 1.59 | 3.12 |
| 3 | Irregularity | 380 | 0.9 | 0.14 | (2) | 2.99 | 3.13 |
| 4 | Good | 108 | 1.9 | 0.25 | No cracks | 1.58 | 3.20 |
| 5 | Good | 94 | 1.8 | 0.27 | No cracks | 1.60 | 3.20 |
| 6 | Irregularity | 139 | 1.3 | 0.20 | (5) | 2.81 | 3.12 |
| 7 | Irregularity | 4000 | 1 | 0.05 | (2) | 6.88 | 3.10 |
| 8 | Irregularity | 143 | 1 | 0.05 | (4) peeled | 1.94 | 3.10 |

*Heat shock resistance: The thickness of tested materials in Comparative Examples 2, 4, and 5 was 1.5 mm. The number in parentheses indicates the number of times cracks occurred in the 20 cycle test.

TABLE 6

| Comp. Example | Nitrogen separation test (Change in the R-T curve) | 1000° C. Heat test (Temperature distribution at each point: ±%) |
|---|---|---|
| 1 | None | 1.0 |
| 2 | None | 1.1 |
| 3 | Some amount of nitrogen released | 0.7 |
| 4 | None | 0.2 |
| 5 | None | 0.4 |
| 6 | Some amount of nitrogen released | 0.6 |
| 7 | None | 1.2 |
| 8 | None | 1.0 |

As shown in Tables 5–6, the test material of Comparative Example 1 exhibited a high resistivity and exhibited inferior soaking properties during heating while causing electric current to flow, due to a low nitrogen gas concentration. The test material of Comparative Example 2 produced film with uneven thickness with irregularity on the surface and exhibited inferior heat shock resistance and soaking properties during heating while causing electric current to flow, due to a high nitrogen gas concentration. The test material of Comparative Example 3 produced film with uneven thickness with irregularity on the surface and exhibited inferior heat shock resistance and soaking properties during heating while causing electric current to flow, due to a low nitrogen gas concentration.

The test materials of Comparative Examples 4 and 5, which were produced under the conditions of a long residence time or a low concentration of raw material gases, respectively, exhibited a reduced deposition rate. The test material of Comparative Example 7, which was produced by the reaction sintering method, produced a film with uneven thickness and irregularity on the surface, and exhibited inferior heat shock resistance, corrosion resistance, and soaking properties during heating while causing electric current to flow. The test material of Comparative Example 8, which is a CVD-SiC film produced on the SiC-formed material obtained by the reaction sintering method, produced a film with uneven thickness and irregularity on the surface, and exhibited inferior heat shock resistance and soaking properties during heating while causing electric current to flow.

As described above, the present invention provides a nitrogen-doped n-type SiC-formed material, consisting of high purity β-type crystals, which exhibits low resistivity and low light transmittance, in addition to other superior characteristics inherently possessed by CVD-SiC, such as high density (poreless), high purity, etc., and is suitably used as a substrate for semiconductor fabricating devices, and a method of manufacturing the SiC-formed material by which the SiC-formed material is obtained at high productivity and improved deposition rate.

The SiC-formed material of the present invention has a high purity, with an impurity content other than N, C, and Si of 150 ppb or less, and releases no nitrogen when subjected to repeated heating and cooling. The material thus exhibits exceptionally superior heat cycle characteristics when used as a heater.

What is claimed is:

1. A silicon carbide material, characterized by possessing a specific gravity of 3.15 or more, light transmittance of 1.1 to 0.05%, and resistivity of $3 \times 10^{-3}$ to $10^{-5}$ Ωm.

2. A material as recited in claim 1, wherein the material further comprises n-type semiconductor characteristics.

3. A silicon carbide material obtained by producing a silicon carbide film on a substrate surface by CVD using a nitrogen gas together with a raw material gas and a carrier gas, and removing the substrate to obtain the material formed from silicon carbide, wherein the raw material gas concentration, in terms of the ratio of the raw material flow rate (l/min) to the carrier gas flow rate (l/min) introduced into a CVD reaction chamber in which the substrate is located, is 5–15 vol %, and the nitrogen gas concentration, in terms of the ratio of the nitrogen gas flow rate (l/min) to raw material gas flow rate (l/min), is 10–120 vol %, the silicon carbide material comprising a specific gravity of 3.15 or more, light transmittance of 1.1 to 0.05%, and resistivity of $3 \times 10^{-3}$ to $10^{-5}$ Ωm.

4. A material as recited in claim 3, wherein the carrier gas is either hydrogen gas or argon gas.

5. A material as recited in claim 3, wherein the carrier gas is a combination of hydrogen gas and argon gas.

6. A material as recited in claim 3, further comprising a means for controlling the substrate between 1100° C. and 1500° C.

7. A material as recited in claim 3, whereby the raw material gas has a retardation time between 7 and 110 seconds.

8. A method of producing a silicon carbide material comprising producing an SiC film on the surface of a substrate by the CVD method using nitrogen gas together with raw material gases, and removing the substrate to obtain the SiC-formed material, wherein the raw material gas concentration, in terms of the ratio of the raw material flow rate (l/min) to the carrier gas flow rate (l/min) introduced into the CVD reaction chamber in which the substrate is located, is 5–15 vol %, the nitrogen gas concentration, in terms of the ratio of the nitrogen gas flow rate (l/min) to the raw material gas flow rate (l/min), is 10–120 vol %, the raw material gas retardation time defined by the following formula is controlled to 7–110 seconds, and the deposition rate is controlled to 20–400 μm/hour, Raw material gas resident time (sec)={(Effective reaction volume in the reaction chamber (l))/(raw material gas flow rate (l/min))}×{(273+20)/(273+Reaction temperature (° C.))}×60.

* * * * *